US012713578B2

(12) United States Patent
Chung et al.

(10) Patent No.: US 12,713,578 B2
(45) Date of Patent: Aug. 18, 2026

(54) MEMORY STRUCTURE AND MANUFACTURING METHOD THEREOF

(71) Applicant: Winbond Electronics Corp., Taichung City (TW)

(72) Inventors: Yi-Hsun Chung, Taichung City (TW); Kai Jen, Taichung City (TW)

(73) Assignee: Winbond Electronics Corp., Taichung City (TW)

(*) Notice: Subject to any disclaimer, the term of this patent is extended or adjusted under 35 U.S.C. 154(b) by 607 days.

(21) Appl. No.: 18/301,270

(22) Filed: Apr. 17, 2023

(65) Prior Publication Data

US 2024/0315000 A1 Sep. 19, 2024

(30) Foreign Application Priority Data

Mar. 13, 2023 (TW) ................................ 112109138

(51) Int. Cl.
*H10B 12/00* (2023.01)

(52) U.S. Cl.
CPC ............ *H10B 12/30* (2023.02); *H10B 12/03* (2023.02); *H10B 12/05* (2023.02)

(58) Field of Classification Search
CPC .. H10D 1/716; H10D 30/6728; H10B 12/395; H10B 12/33
See application file for complete search history.

(56) References Cited

U.S. PATENT DOCUMENTS 11,094,699 B1 8/2021 Brewer et al.
11,295,786 B2 4/2022 Kang et al.
2016/0293605 A1 10/2016 Yamazaki et al.
2020/0411528 A1* 12/2020 Sung ...................... H10B 12/05
2021/0335788 A1 10/2021 Takemura et al.
2022/0246633 A1 8/2022 Arai

FOREIGN PATENT DOCUMENTS

CN 115701210 2/2023
CN 115701210 A * 2/2023 ............ H10D 1/716

OTHER PUBLICATIONS

"Office Action of Taiwan Counterpart Application", issued on Mar. 11, 2024, p. 1-p. 7.

* cited by examiner

*Primary Examiner* — Edward Chin
(74) *Attorney, Agent, or Firm* — JCIPRNET

(57) ABSTRACT

A memory structure includes a substrate structure and a memory cell disposed on the substrate structure. The memory cell includes device layers stacked on the substrate structure, a word line, a first contact, and a second contact. The device layer includes a semiconductor layer, a first doped region, a second doped region, a channel region located between the first doped region and the second doped region, and a capacitor. The first and second doped regions and the channel region are disposed in the semiconductor layer. The capacitor includes a first electrode layer, a second electrode layer, and a dielectric layer located between the first and second electrode layers. The word line is disposed on a sidewall of the channel layer. The first contact is electrically connected to the first doped regions. The second contact is electrically connected to the second electrode layers. A manufacturing method thereof is provided.

11 Claims, 15 Drawing Sheets

MEMORY STRUCTURE AND MANUFACTURING METHOD THEREOF

CROSS-REFERENCE TO RELATED APPLICATION

This application claims the priority benefit of Taiwanese application no. 112109138, filed on Mar. 13, 2023. The entirety of the above-mentioned patent application is hereby incorporated by reference herein and made a part of this specification.

BACKGROUND

Technical Field

The disclosure relates to a memory structure and a manufacturing method thereof. In particular, the disclosure relates to a dynamic random access memory (DRAM) structure and a manufacturing method thereof.

Description of Related Art

A DRAM includes a transistor and a capacitor coupled to each other, and the capacitor serves as a storage node. However, how to increase the capacitance value of the capacitor and the cell density in the DRAM is currently an aim to put continuous efforts in.

SUMMARY

The disclosure provides a memory structure and a manufacturing method thereof, in which the capacitance value and the cell density may be increased.

According to an embodiment of the disclosure, a memory structure includes a substrate structure and a memory cell. The memory cell is disposed on the substrate structure. The memory cell includes a plurality of device layers, a word line, a first contact, and a second contact. The plurality of device layers are stacked on the substrate structure. The device layer includes a semiconductor layer, a first doped region, a second doped region, a channel region, and a capacitor. The first doped region, the second doped region, and the channel region are disposed in the semiconductor layer. The channel region is located between the first doped region and the second doped region. The capacitor is disposed on the semiconductor layer. The capacitor includes a first electrode layer, a second electrode layer, and a dielectric layer. The dielectric layer is located between the first electrode layer and the second electrode layer. The word line is disposed on a sidewall of the channel layer. The first contact is disposed in the plurality of device layers. The first contact is electrically connected to the plurality of first doped regions. The second contact is disposed in the plurality of device layers. The second contact is electrically connected to the plurality of second electrode layers.

According to an embodiment of the disclosure, a manufacturing method of a memory structure includes the following. A substrate structure is provided. A memory cell is formed on the substrate structure. The memory cell includes a plurality of device layers, a word line, a first contact, and a second contact. The plurality of device layers are stacked on the substrate structure. The device layer includes a semiconductor layer, a first doped region, a second doped region, a channel region, and a capacitor. The first doped region, the second doped region, and the channel region are disposed in the semiconductor layer. The channel region is located between the first doped region and the second doped region. The capacitor is disposed on the semiconductor layer. The capacitor includes a first electrode layer, a second electrode layer, and a dielectric layer. The dielectric layer is located between the first electrode layer and the second electrode layer. The word line is disposed on a sidewall of the channel layer. The first contact is disposed in the plurality of device layers. The first contact is electrically connected to the plurality of first doped regions. The second contact is disposed in the plurality of device layers. The second contact is electrically connected to the plurality of second electrode layers.

Based on the foregoing, in the memory structure and the manufacturing method thereof according to the embodiments of the disclosure, the plurality of capacitors in the plurality of device layers are stacked on the substrate structure, the first contact is electrically connected to the plurality of first doped regions, and the second contact is electrically connected to the plurality of second electrode layers. As a result, the plurality of capacitors stacked on the substrate structure may be connected in parallel to increase the capacitance value. In addition, since the capacitance value may be increased by the plurality of capacitors stacked on the substrate structure and connected in parallel, it helps reduce the area of the memory cell, and may increase the cell density.

DESCRIPTION OF THE EMBODIMENTS

Figure 1A:
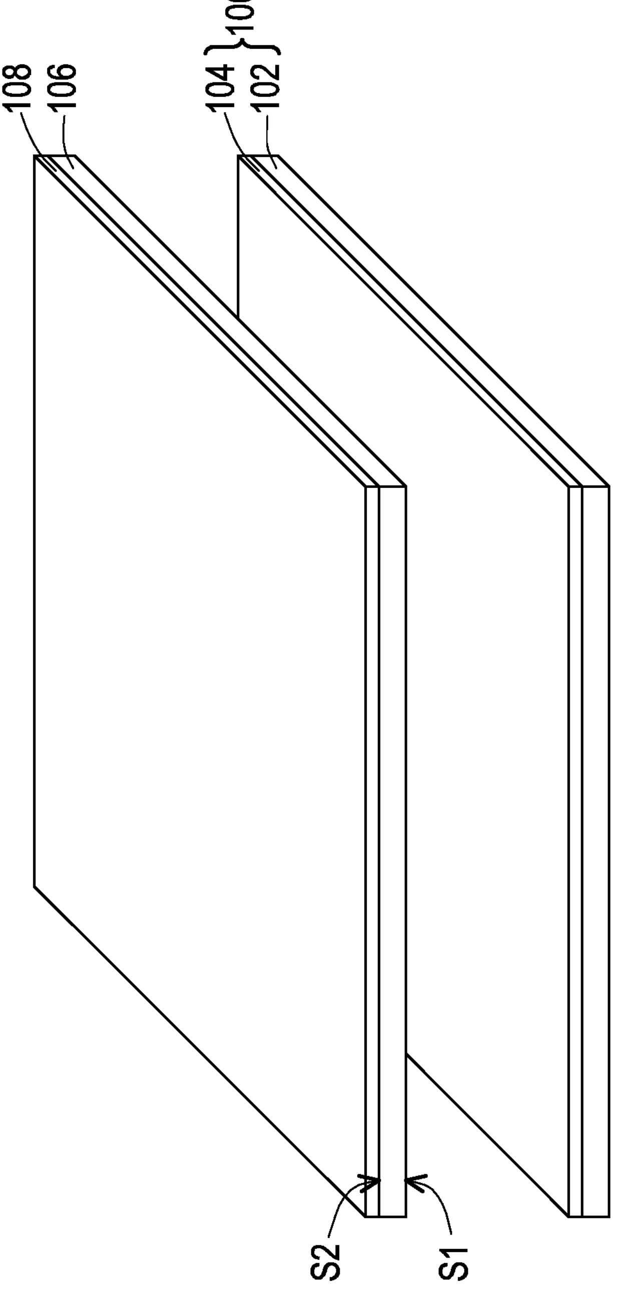
FIG. 1A to FIG. 1O are cross-sectional views of a manufacturing process of a memory structure according to some embodiments of the disclosure.

Referring to FIG. 1A, a substrate structure 100 is provided. The substrate structure 100 may include a substrate 102 and a bonding layer 104. In some embodiments, the substrate 102 may be a semiconductor substrate, such as a silicon substrate. The substrate 102 may have required circuit structures (not shown). For example, the substrate 102 may have required components, such as semiconductor devices (e.g., active devices and/or passive devices), interconnection structures, and/or dielectric layers, of which the description is omitted here. The bonding layer 104 is disposed on the substrate 102. The material of the bonding layer 104 is, for example, a dielectric material, such as oxide (e.g., silicon oxide).

Next, a semiconductor material layer 106 and a bonding material layer 108 are provided. The semiconductor material layer 106 may have a surface S1 and a surface S2 opposite to each other. In some embodiments, the semiconductor material layer 106 may be a semiconductor substrate, such as a silicon substrate. The bonding material layer 108 is disposed on the surface S2 of the semiconductor material layer 106. The material of the bonding material layer 108 is, for example, a dielectric material, such as oxide (e.g., silicon oxide).

Figure 1B:
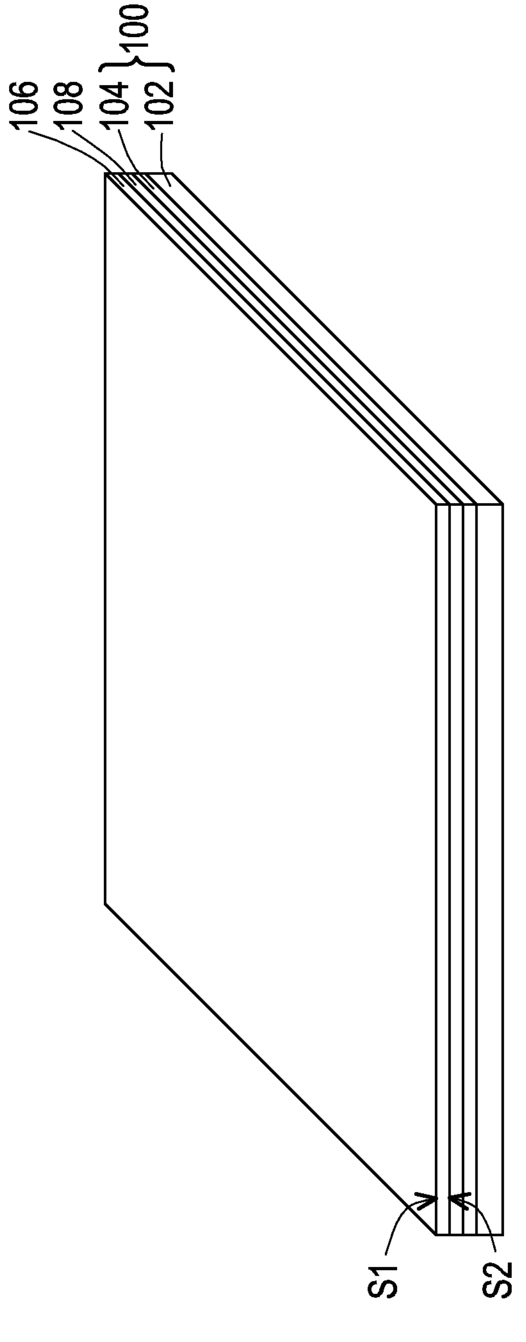

Referring to FIG. 1B, the bonding material layer 108 may be bonded to the bonding layer 104. In some embodiments, the bonding material layer 108 may be bonded to the bonding layer 104 by, for example, fusion bonding, such as oxide fusion bonding.

In some embodiments, a thinning process may be performed on the semiconductor material layer 106 to reduce the thickness of the semiconductor material layer 106. The thinning process is, for example, a grinding process or a chemical mechanical grinding process. In some embodiments, before the bonding material layer 108 is bonded to the bonding layer 104, thinning may first be performed on the semiconductor material layer 106 by implanting hydrogen ions ($H^+$) in the semiconductor material layer 106 to form a break.

Figure 1C:
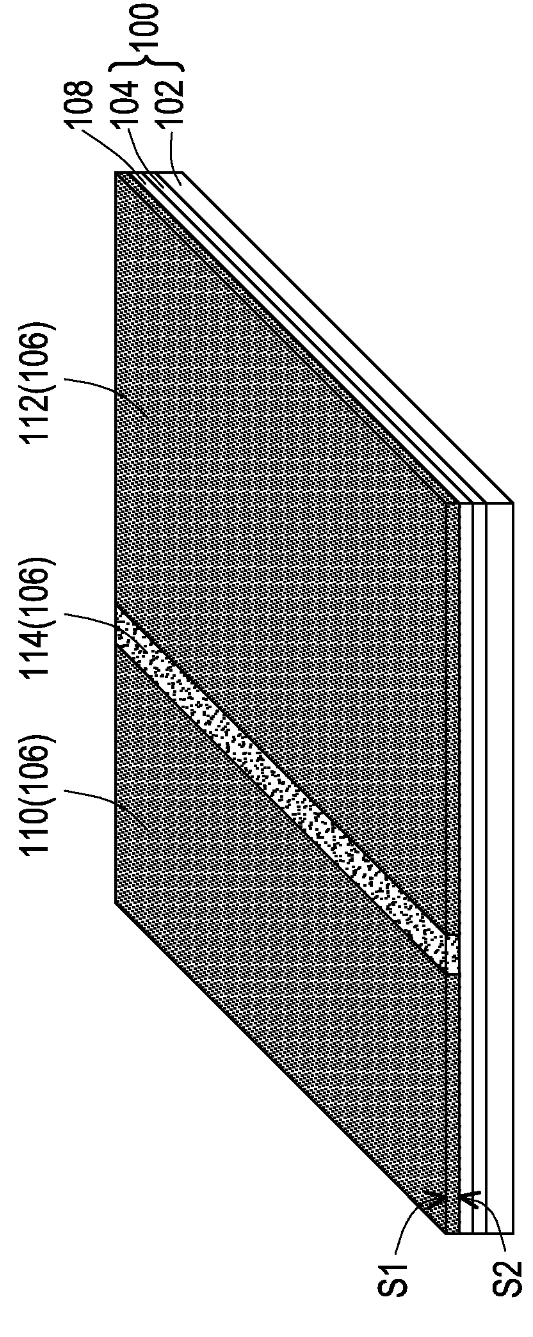

Referring to FIG. 1C, a doped layer 110, a doped layer 112, and a channel layer 114 may be formed in the semiconductor material layer 106. The channel layer 114 may be located between the doped layer 110 and the doped layer 112. In this embodiment, the doped layer 110 and the doped layer 112 may have a first conductivity type (e.g., an N-type), and the channel layer 114 may have a second conductivity type (e.g., a P-type). The first conductivity type may be one of the N-type conductivity type and the P-type conductivity type, and the second conductivity type may be the other of the N-type conductivity type and the P-type conductivity type. In other embodiments, the first conductivity type may be the P-type conductivity type, and the second conductivity type may be the N-type conductivity type. In some embodiments, by ion implantation, a first conductivity type dopant may be implanted in the semiconductor material layer 106 to form the doped layer 110 and the doped layer 112, and a second conductivity type dopant may be implanted to form the channel layer 114. In other embodiments, the semiconductor material layer 106 with the second conductivity type may first be provided, and the first conductivity type dopant may then be implanted in the semiconductor material layer 106 by ion implantation to form the doped layer 110 and the doped layer 112, and also to define the channel layer 114.

Figure 1D:
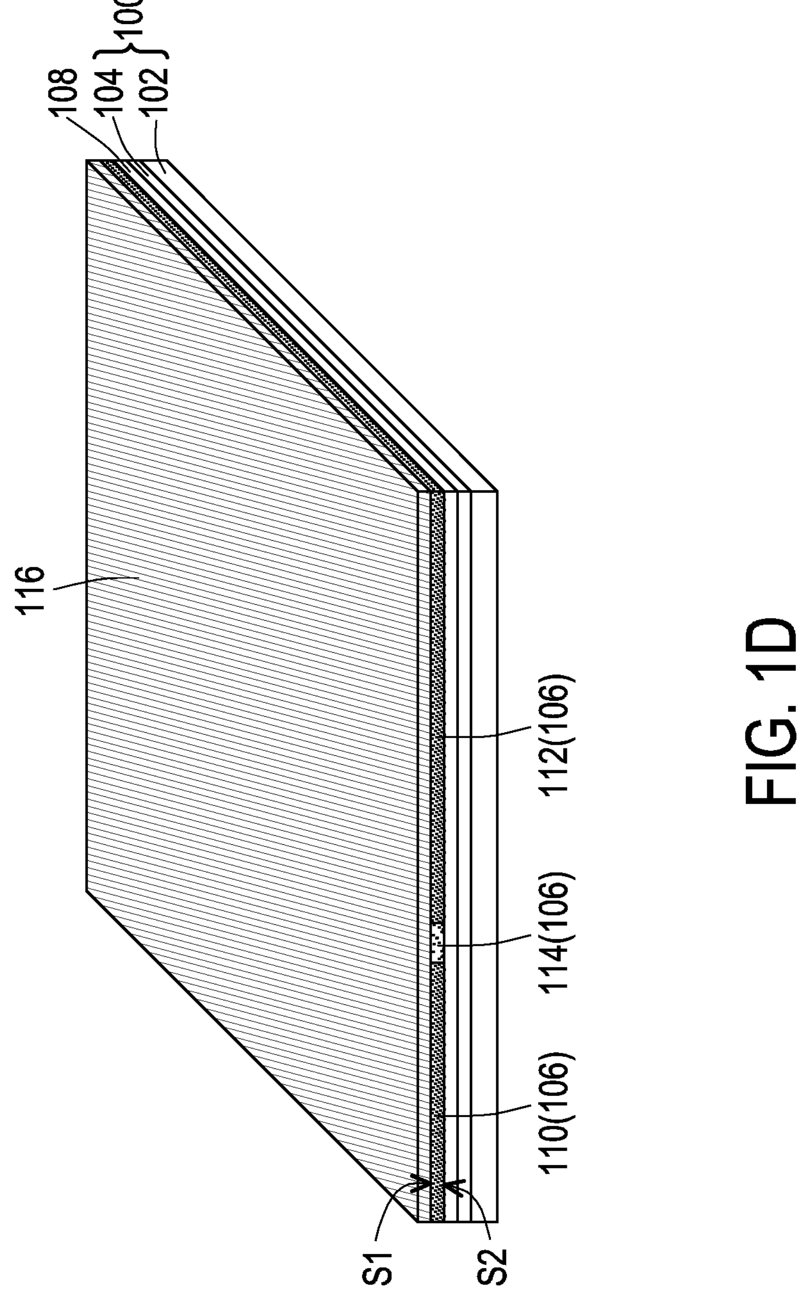

Referring to FIG. 1D, an electrode material layer 116 may be formed on the surface S1 of the semiconductor material layer 106. The material of the electrode material layer 116 is, for example, a conductive material, such as titanium nitride (TiN). The electrode material layer 116 is formed by, for example, chemical vapor deposition (CVD), physical vapor deposition (PVD), or atomic layer deposition (ALD).

Figure 1E:
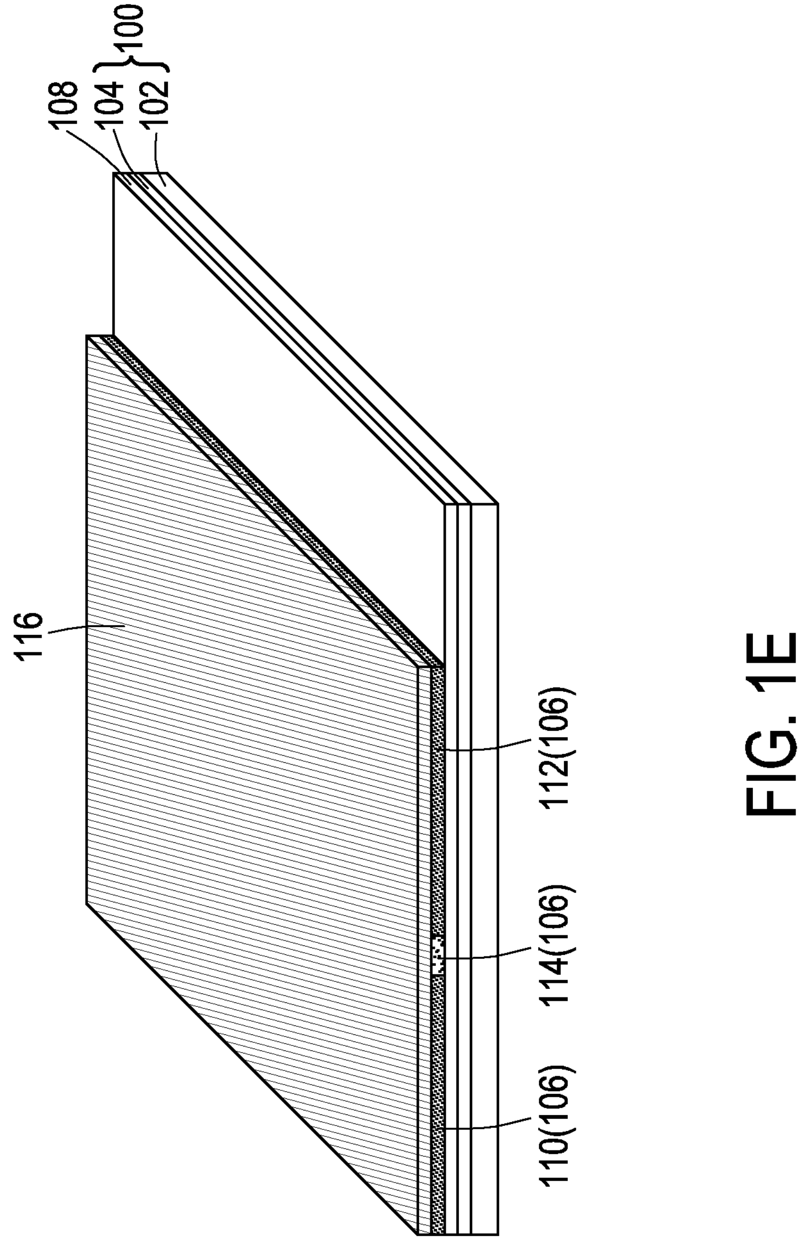

Referring to FIG. 1E, the electrode material layer 116 and the semiconductor material layer 106 may be patterned to expose part of the bonding material layer 108. For example, part of the bonding material layer 108 located above the doped layer 112 may be exposed. In some embodiments, the electrode material layer 116 and the semiconductor material layer 106 may be patterned by lithography and etching processes.

Figure 1F:
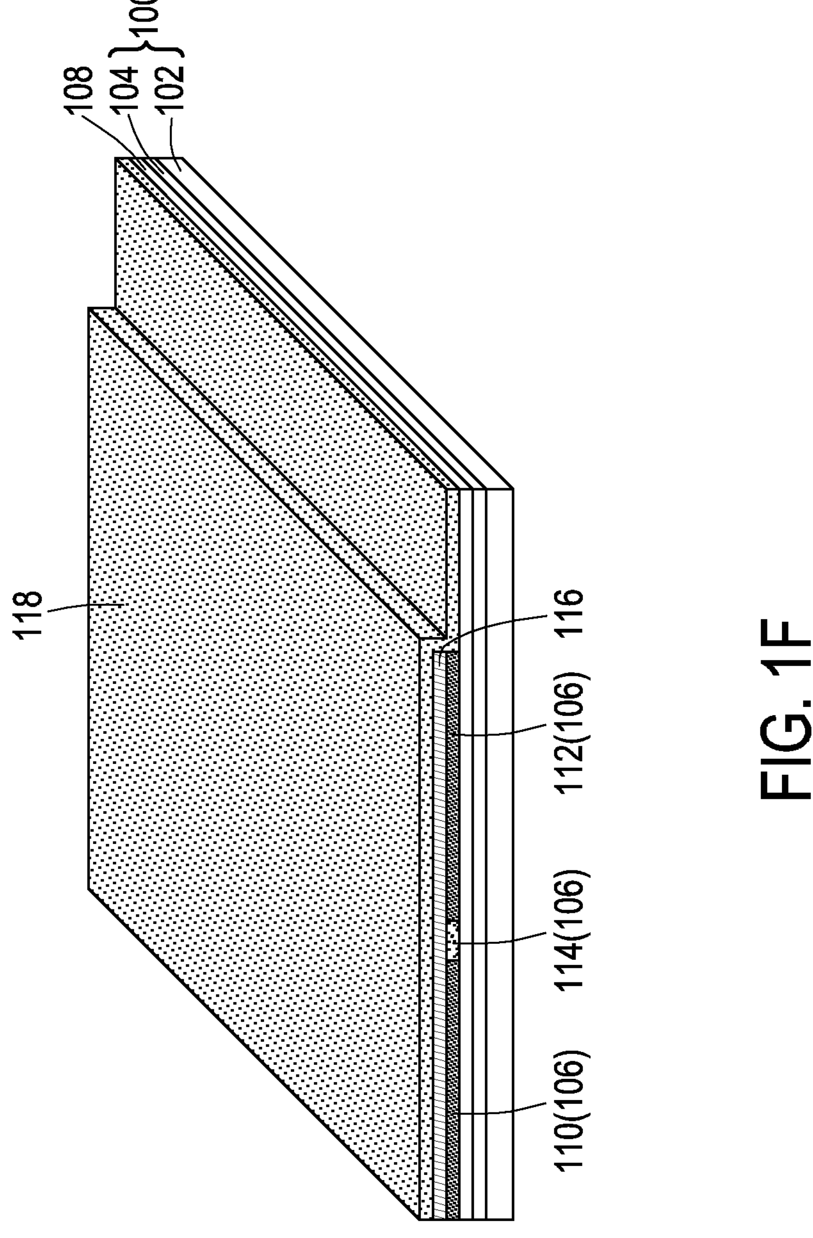

Referring to FIG. 1F, a dielectric material layer 118 may be formed on the electrode material layer 116 and the bonding material layer 108. The material of the dielectric material layer 118 is, for example, a high dielectric constant material. The dielectric material layer 118 is formed by, for example, CVD or ALD.

Figure 1G:
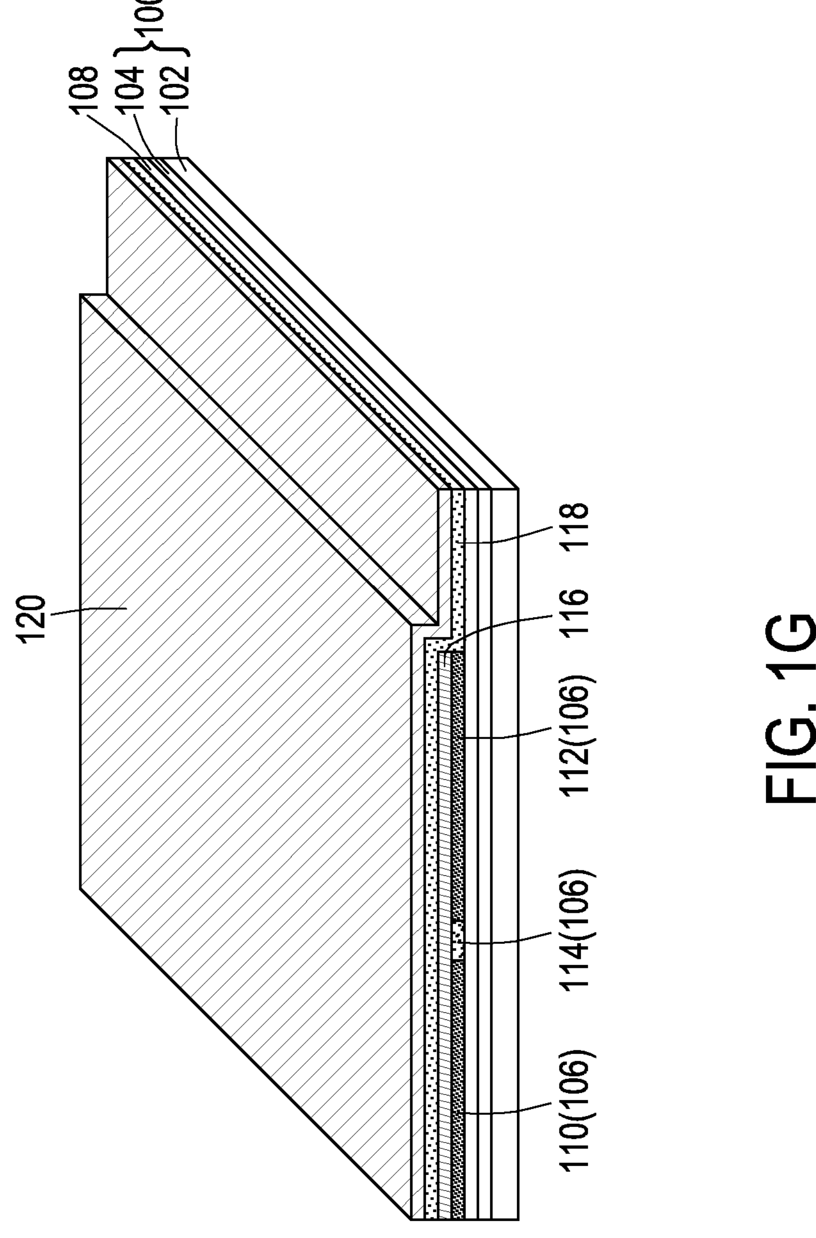

Referring to FIG. 1G, an electrode material layer 120 may be formed on the dielectric material layer 118. The material of the electrode material layer 120 is, for example, a conductive material, such as titanium nitride. The electrode material layer 120 is formed by, for example, CVD, PVD, or ALD.

Figure 1H:
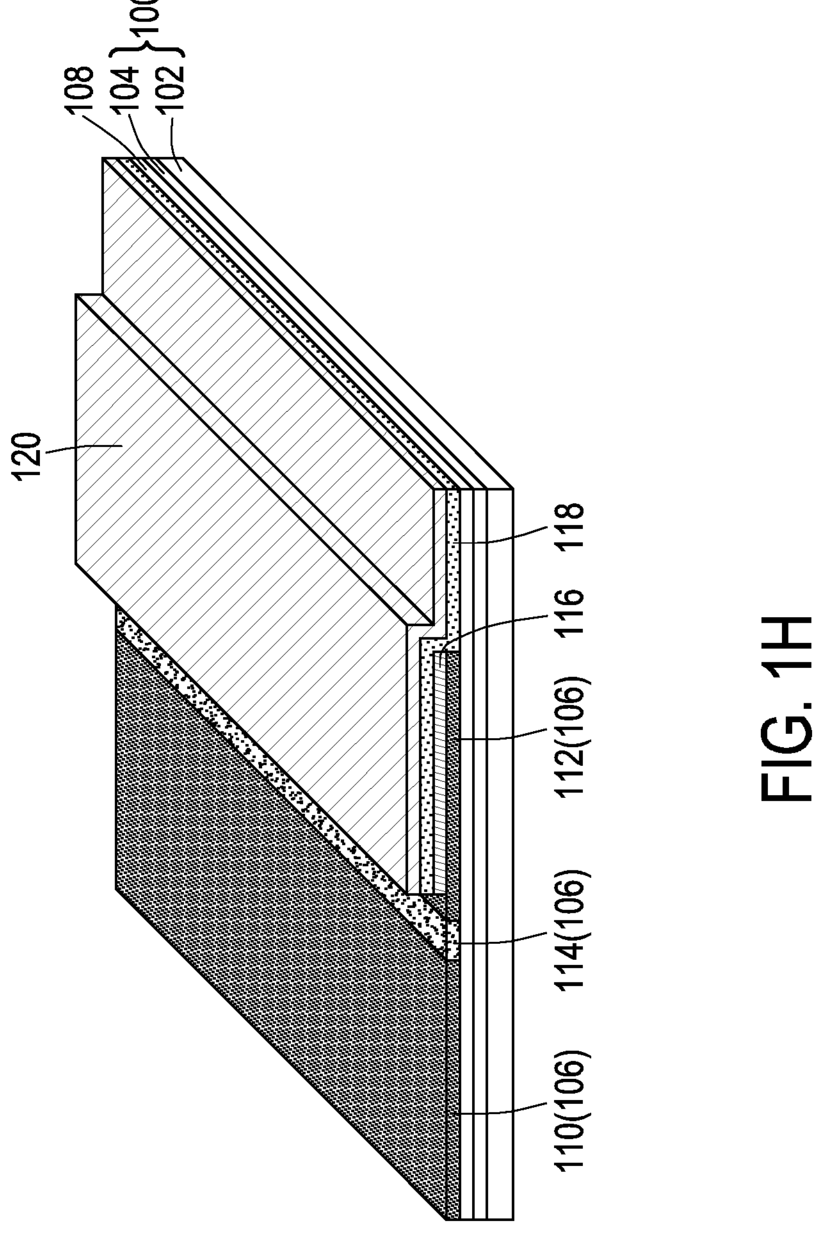

Referring to FIG. 1H, the electrode material layer 120, the dielectric material layer 118, and the electrode material layer 116 may be patterned to expose the doped layer 110 and the channel layer 114. In some embodiments, after the electrode material layer 120, the dielectric material layer 118, and the electrode material layer 116 are patterned, part of the doped layer 112 may further be exposed. In some embodiments, the electrode material layer 120, the dielectric material layer 118, and the electrode material layer 116 may be patterned by lithography and etching processes.

Figure 1I:
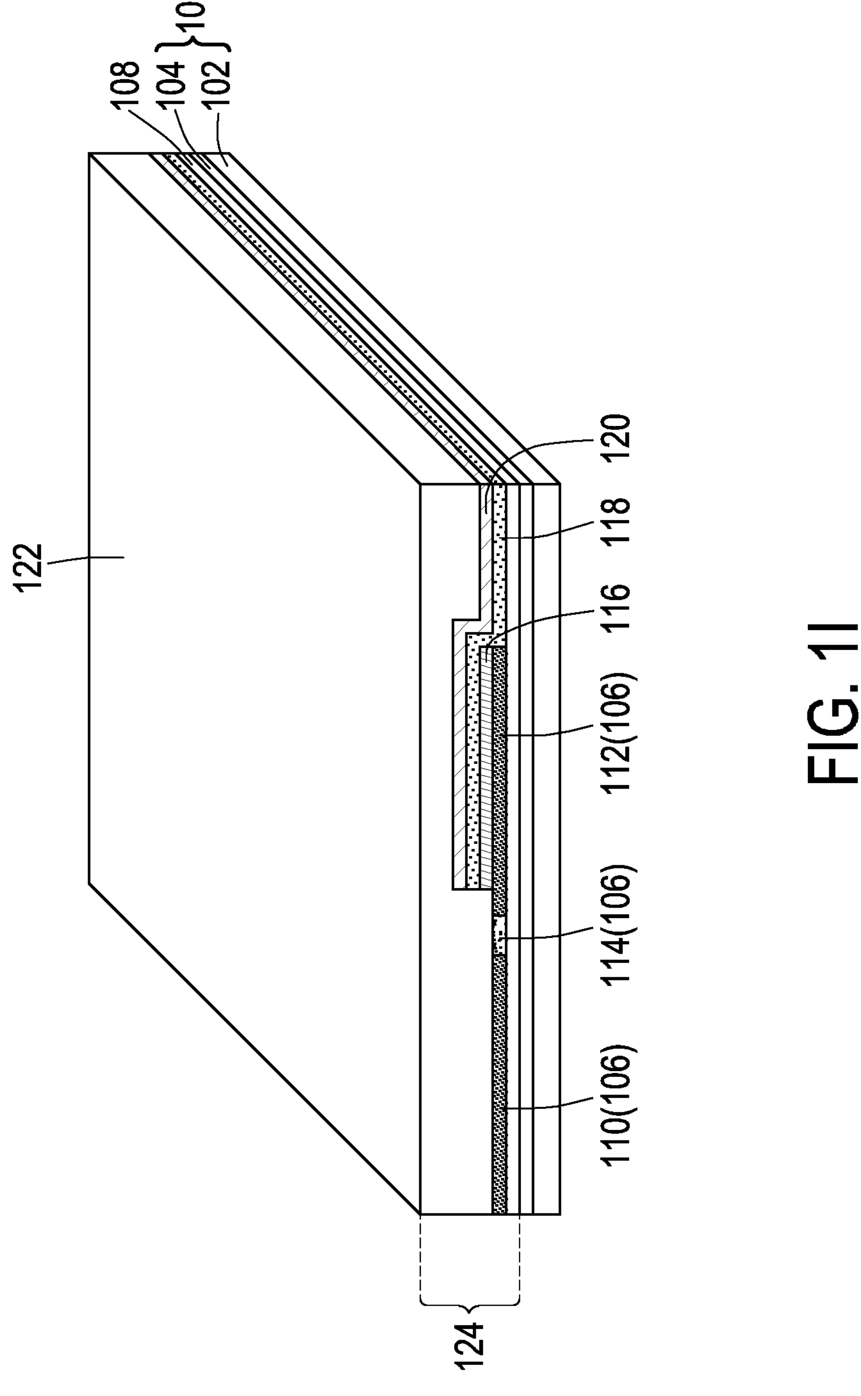

Referring to FIG. 1I, a bonding material layer 122 may be formed on the doped layer 110, the channel layer 114, and the electrode material layer 120. In some embodiments, the bonding material layer 122 may further be formed on part of the doped layer 112. The material of the bonding material layer 122 is, for example, a dielectric material, such as oxide (e.g., silicon oxide). The bonding material layer 122 is formed by, for example, CVD. In some embodiments, a planarization process may be performed on the bonding material layer 122. The planarization process is, for example, a chemical mechanical grinding process.

In the manner above, a device material layer 124 may be formed on the substrate structure 100. In some embodiments, the device material layer 124 may include a semiconductor material layer 106, a bonding material layer 108, a doped layer 110, a doped layer 112, a channel layer 114, an electrode material layer 116, a dielectric material layer 118, an electrode material layer 120, and a bonding material layer 122.

Figure 1J:
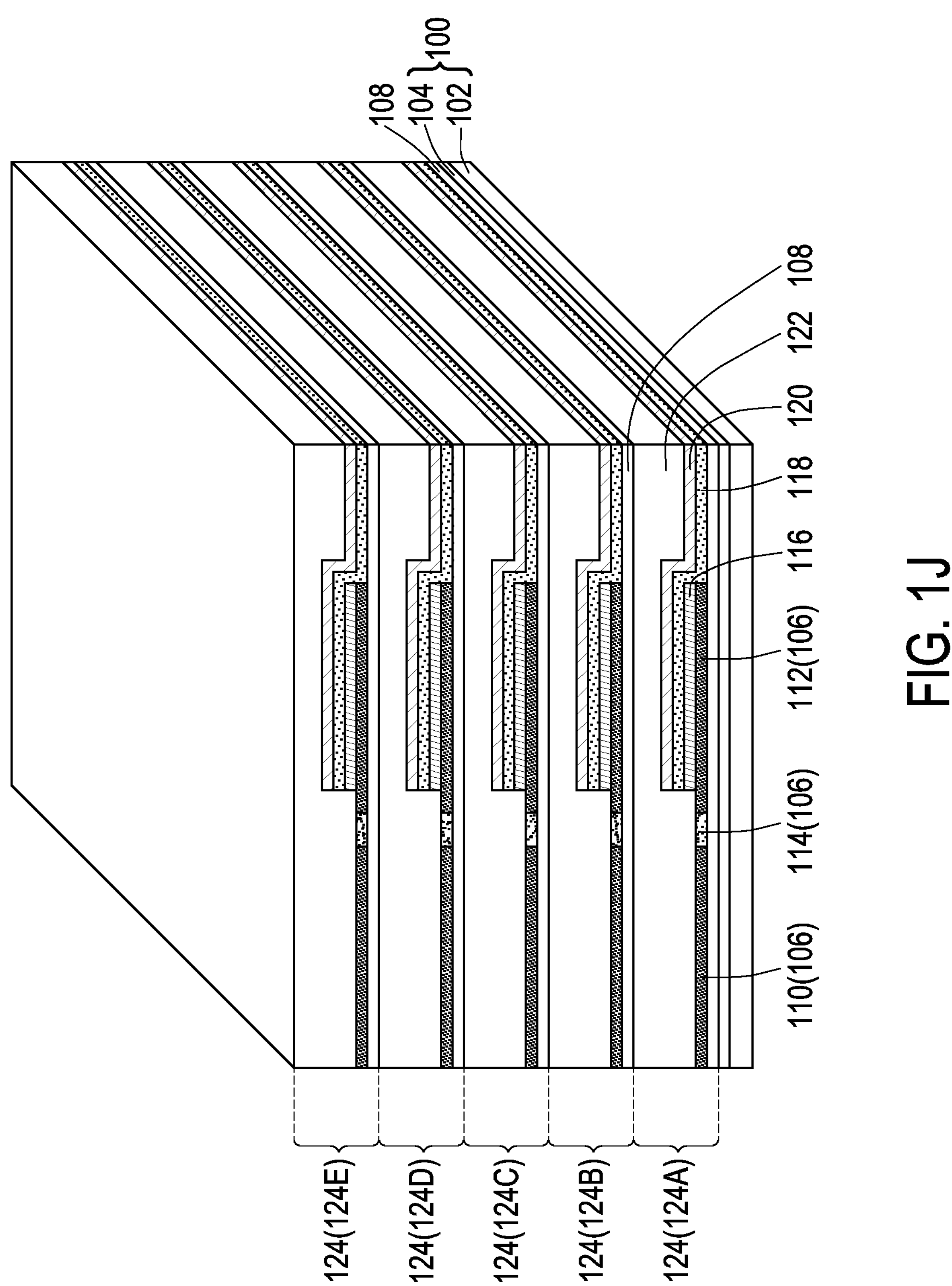

Referring to FIG. 1J, after the device material layer 124 is formed, the steps of forming the device material layer 124 may be repeated to form the remaining device material layers 124 (e.g., a device material layer 124B through a device material layer 124E) above the device material layer 124 (e.g., a device material layer 124A). Accordingly, the plurality of device material layers 124 are stacked on the substrate structure 100. In addition, the bonding material layer 108 of one of two adjacent device material layers 124 may be bonded to the bonding material layer 122 of the other one of two adjacent device material layers 124. For example, the bonding material layer 108 in the device material layer 124B may be bonded to the bonding material layer 122 in the device material layer 124A. In some embodiments, the bonding material layer 108 is bonded to the bonding material layer 122 by, for example, fusion bonding, such as oxide fusion bonding. In addition, the number of device material layers 124 is not limited to the number shown in the drawings.

Figure 1K:
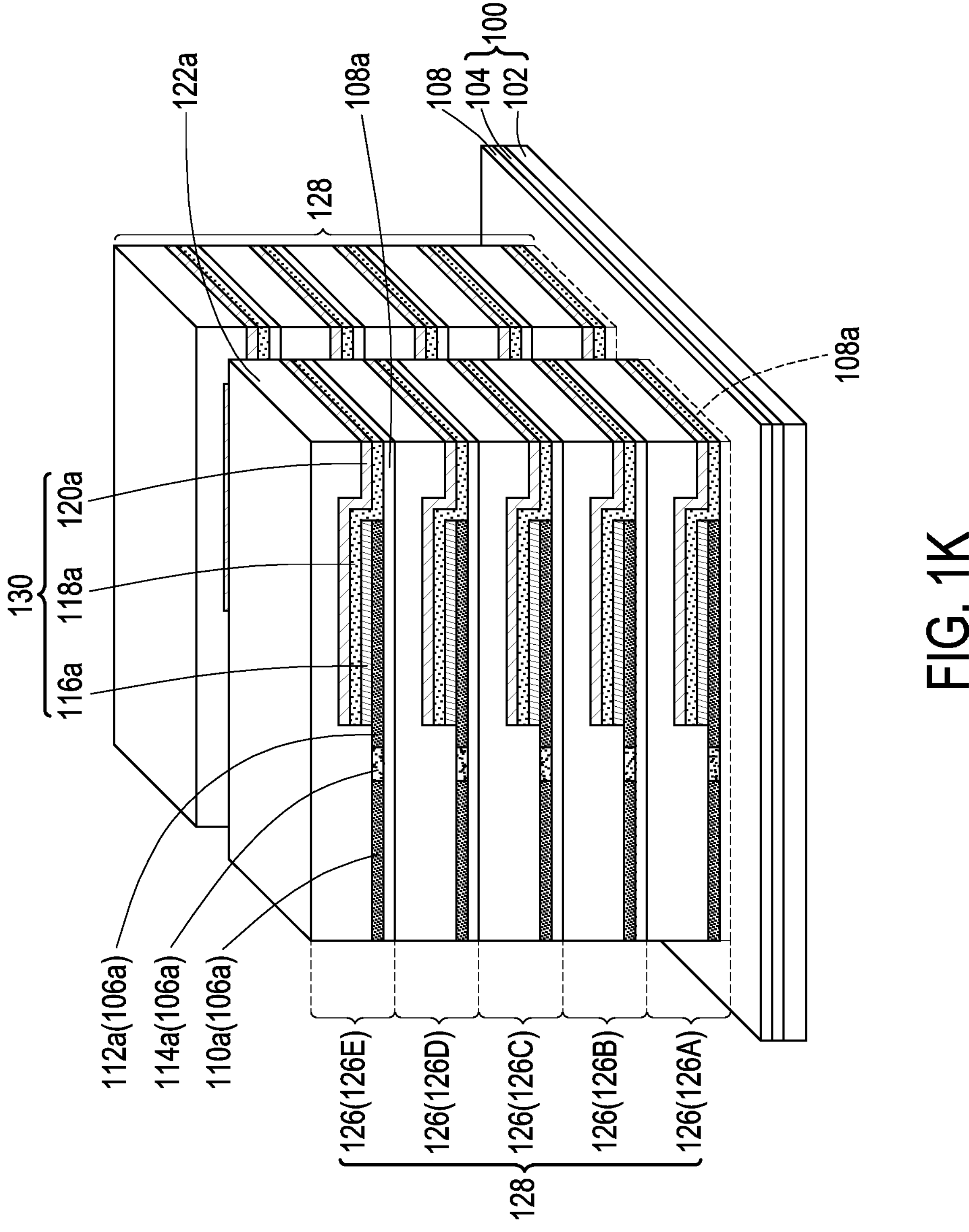

Referring to FIG. 1K, the plurality of device material layers 124 may be patterned to form a plurality of device layers 126, and form a device layer stack 128 by stacking on the substrate structure 100. In some embodiments, the plurality of device material layers 124 may be patterned by lithography and etching processes.

In some embodiments, forming a device layer 126A to a device layer 126E may include the following steps. The bonding material layer 122, the electrode material layer 120, the dielectric material layer 118, the electrode material layer 116, the semiconductor material layer 106, the doped layer 110, the doped layer 112, and the channel layer 114 are patterned to form a bonding layer 122*a*, an electrode layer 120*a*, a dielectric layer 118*a*, an electrode layer 116*a*, a semiconductor layer 106*a*, a doped region 110*a*, a doped region 112*a*, and a channel region 114*a*. Accordingly, the device layer 126A to the device layer 126E may be formed. In some embodiments, forming the device layer 126B to the device layer 126E further includes simultaneously patterning the bonding material layer 108 to form a bonding layer 108*a*. The device layer 126A to the device layer 126E may each include a bonding layer 122*a*, a capacitor 130, a semiconductor layer 106*a*, a doped region 110*a*, a doped region 112*a*, and a channel region 114*a*. The device layer 126B to the device layer 126E further include a bonding layer 108*a*. The capacitor 130 includes an electrode layer 120*a*, a dielectric layer 118*a*, and an electrode layer 116*a*.

In some embodiments, the bonding material layer 108 closest to the substrate structure 100 is not patterned, and the bonding layer 108*a* in the device layer 126A may be part of the bonding material layer 108. In other words, the bonding layers 108*a* in two adjacent device layers 126A may be connected to each other through the bonding material layer 108 located in between, but the disclosure is not limited thereto. In some embodiments, during the patterning process above, part of the bonding material layer 108 closest to the substrate structure 100 may be removed, such that the thickness of the bonding material layer 108 is thinned. In other embodiments, forming the device layer 126A may further include patterning the bonding material layer 108 closest to the substrate structure 100, such that the bonding layers 108*a* in two adjacent device layers 126A are separated from each other.

Figure 1L:
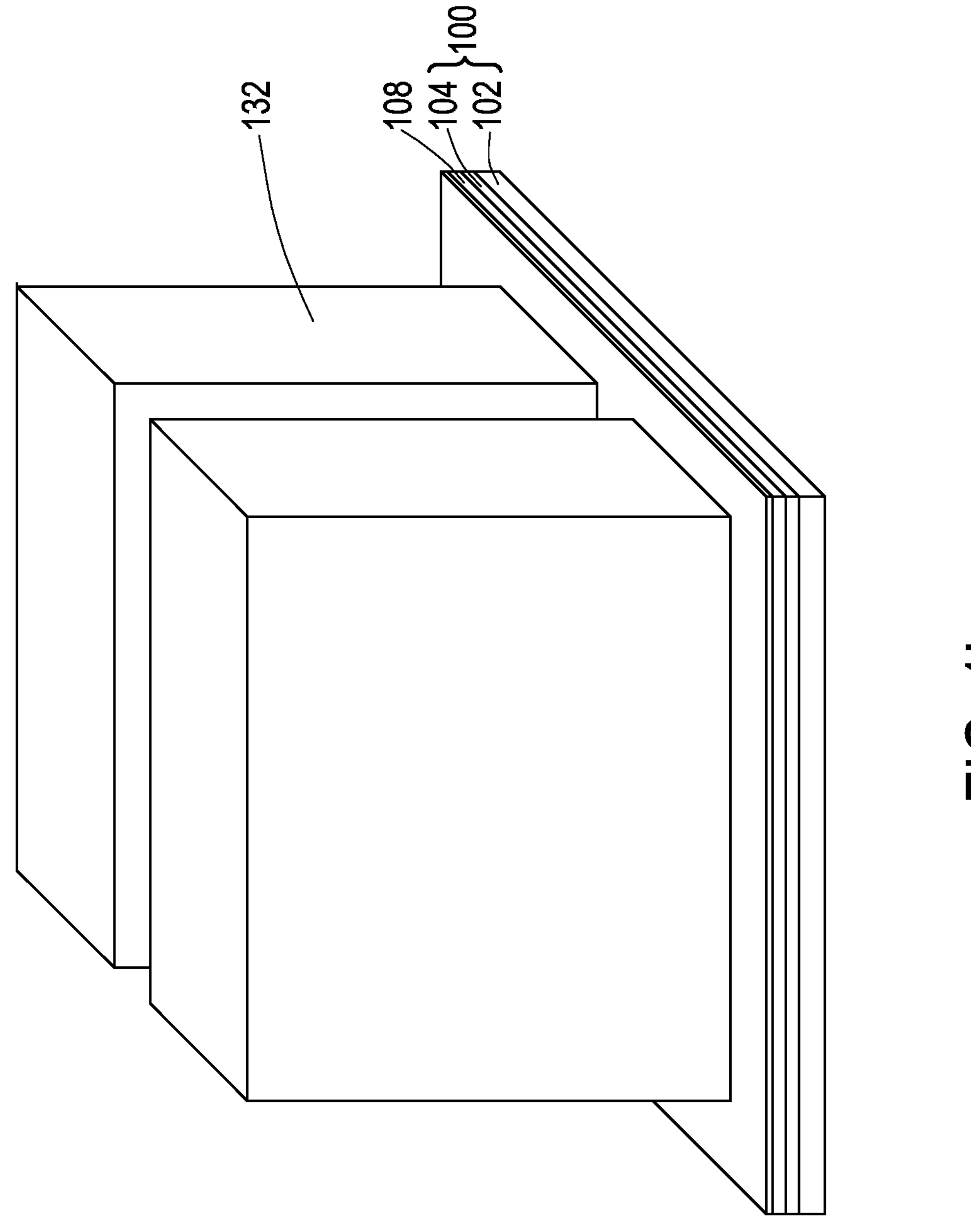

Referring to FIG. 1L, a gate dielectric material layer 132 may be conformally formed on the plurality of device layers 126 and the bonding material layer 108. The material of the gate dielectric material layer 132 is, for example, oxide (e.g., silicon oxide). The gate dielectric material layer 132 is formed by, for example, CVD.

Figure 1M:
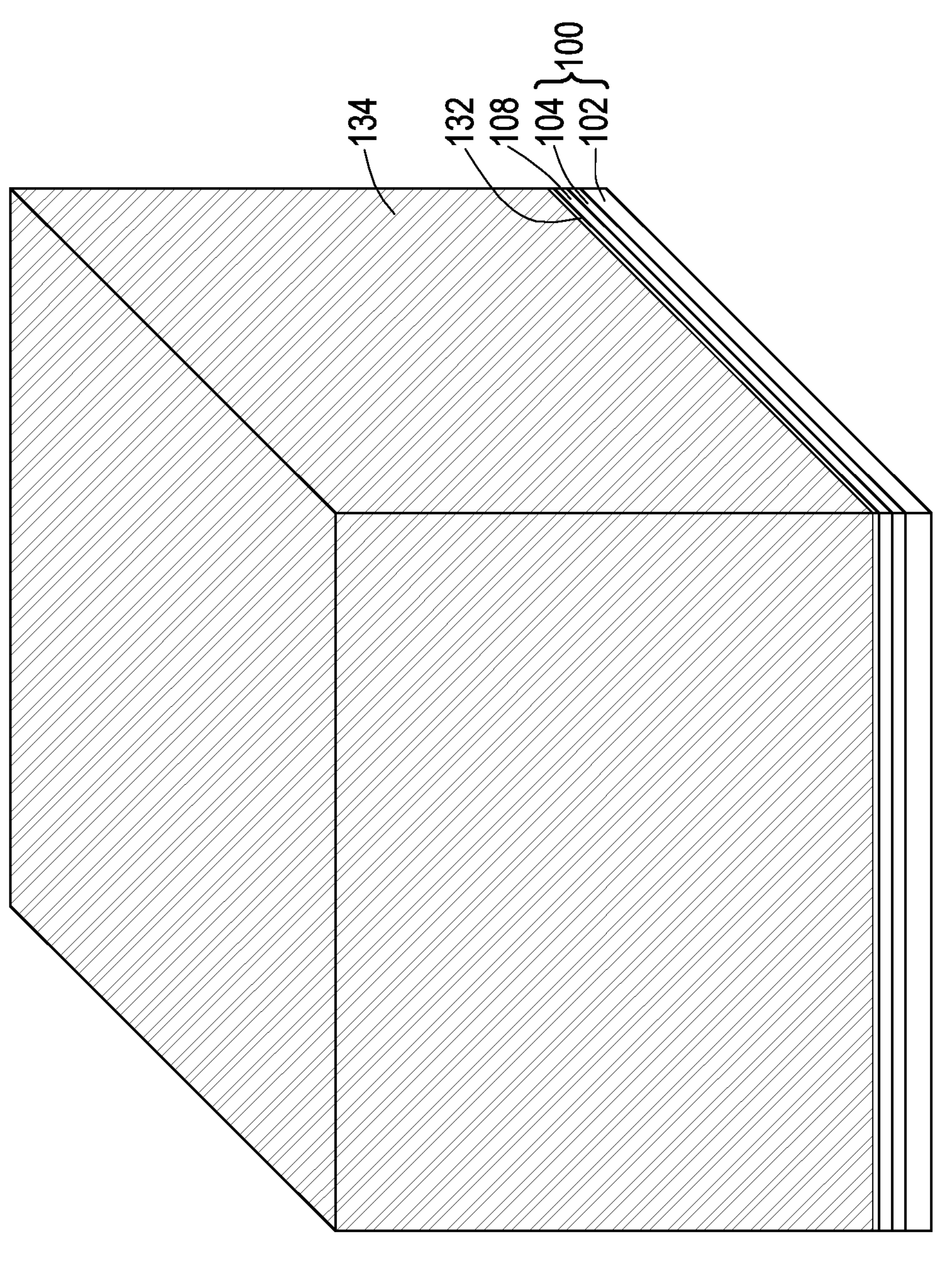

Referring to FIG. 1M, a word line material layer 134 may be formed on the gate dielectric material layer 132. The word line material layer 134 may be filled in the gap between the device layer stacks 128. The material of the word line material layer 134 is, for example, a conductive material, such as doped polysilicon. The word line material layer 134 is formed by, for example, CVD.

Figure 1N:
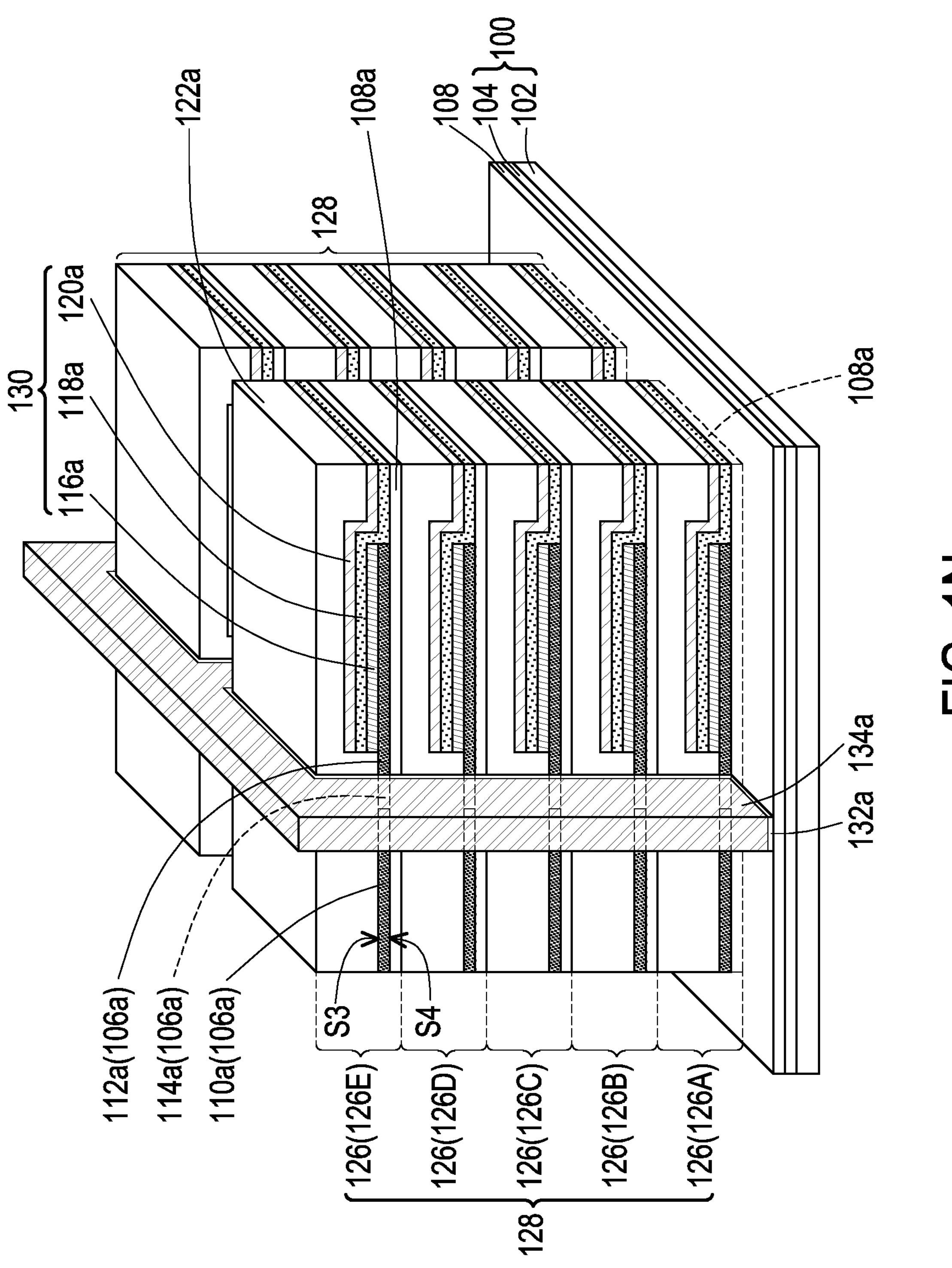

Referring to FIG. 1N, the word line material layer 134 and the gate dielectric material layer 132 may be patterned to form a word line 134*a* and a gate dielectric layer 132*a*. The word line 134*a* is located on a sidewall of the channel layer 114. The gate dielectric layer 132*a* is located between the word line 134*a* and the channel region 114*a*. In some embodiments, the word line material layer 134 and the gate dielectric material layer 132 may be patterned by lithography and etching processes.

Figure 1O:
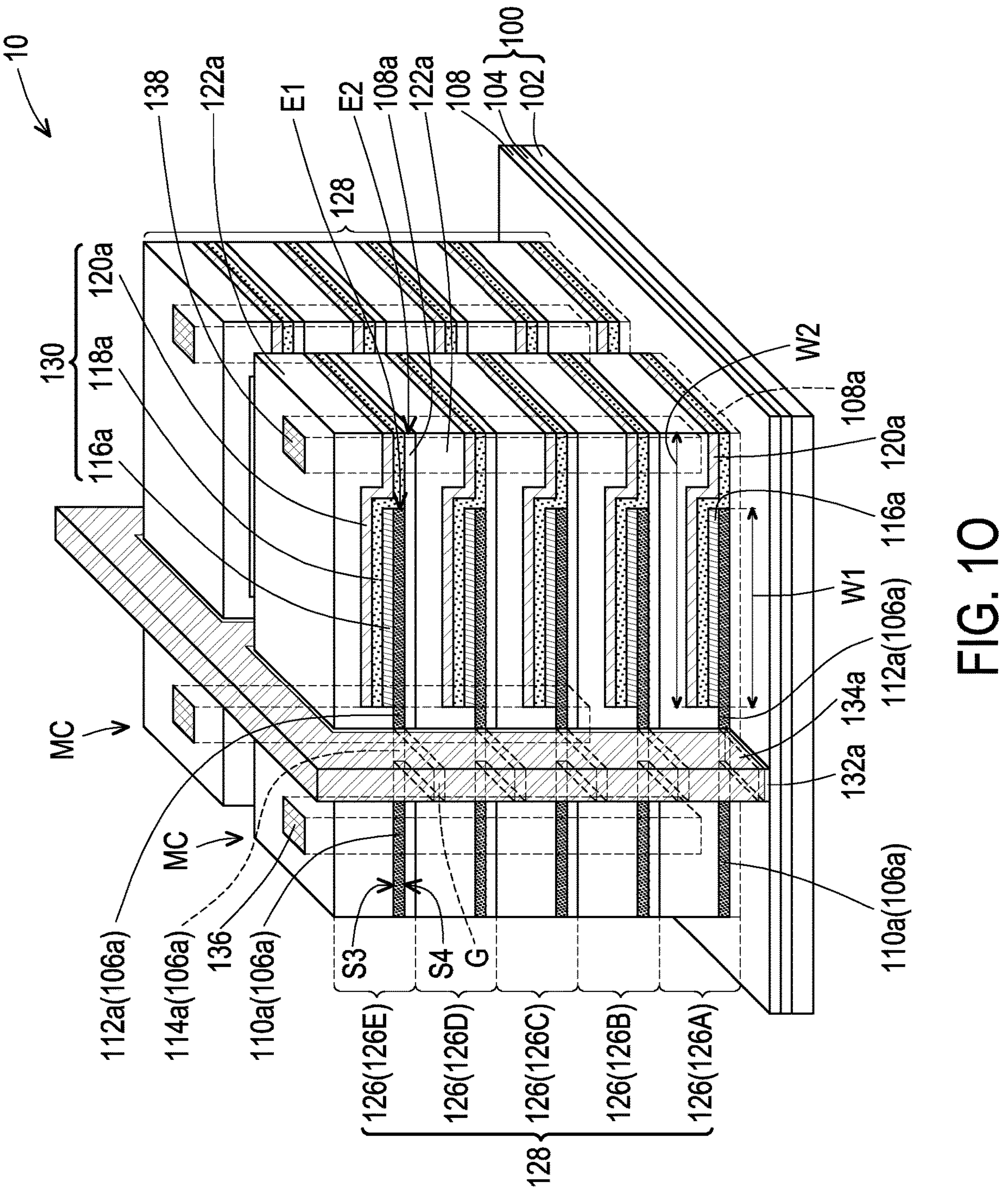

Referring to FIG. 1O, a contact 136 and a contact 138 may be formed in the plurality of device layers 126. The contact 136 is electrically connected to the plurality of doped regions 110*a*. The contact 138 is electrically connected to the plurality of electrode layers 120*a*. The material of the contact 136 and the contact 138 is, for example, a conductive material, such as tungsten, aluminum, or copper. The contact 136 and the contact 138 may be formed by the following, for example. First, an opening (not shown) exposing the bottommost doped region 110*a* and an opening (not shown) exposing the bottommost electrode layer 120*a* are formed in the plurality of device layers 126. Next, a contact material layer (not shown) filled in the openings is formed. Then, the contact material layer outside the openings is removed to form the contact 136 and the contact 138. In some embodiments, an interconnect structure (not shown) electrically connected to the contact 136 and an interconnect structure (not shown) electrically connected to the contact 138 may further be formed.

In the method above, a memory cell MC may be formed on the substrate structure 100. Hereinafter, a memory structure 10 of the embodiments above is described with FIG. 1O. Although the method of forming the memory structure 10 is described by taking the method above as an example, the disclosure is not limited thereto.

The memory structure 10 includes a substrate structure 100 and a memory cell MC. The substrate structure 100 may include a substrate 102 and a bonding layer 104. The bonding layer 104 is disposed on the substrate 102.

The memory cell MC is disposed on the substrate structure 100. The memory cell MC includes a plurality of device layers 126, a word line 134*a*, a contact 136, and a contact 138. The plurality of device layers 126 are stacked on the substrate structure 100. The device layer 126 includes a semiconductor layer 106*a*, a doped region 110*a*, a doped region 112*a*, a channel region 114*a*, and a capacitor 130. The semiconductor layer 106*a* may have a surface S3 and a surface S4 opposite to each other. The doped region 110*a*, the doped region 112*a*, and the channel region 114*a* are disposed in the semiconductor layer 106*a*. The doped region 110*a* and the doped region 112*a* may be separated from each other. The channel region 114*a* is located between the doped region 110*a* and the doped region 112*a*.

In some embodiments, the memory cell MC may include a device layer stack 128. The device layer stack 128 may include a plurality of device layers 126 stacked on the substrate structure 100. In some embodiments, the stack structure located directly above the bottommost doped region 110*a* of the device layer stack 128 may be different from the stack structure located directly above the bottommost doped region 112*a* of the device layer stack 128.

In some embodiments, the capacitor 130 is disposed on the surface S3 of the semiconductor layer 106*a*. The capacitor 130 includes an electrode layer 116*a*, an electrode layer 120*a*, and a dielectric layer 118*a*. The electrode layer 116*a* may be electrically connected to the doped region 112*a*. The electrode layer 116*a* and the doped region 110*a* may be located on different sides of the channel region 114*a*. The electrode layer 116*a* and the doped region 112*a* may be located on the same side of the channel region 114*a*. A width W2 of the electrode layer 120*a* may be greater than a width W1 of the electrode layer 116*a*. The dielectric layer 118*a* is located between the electrode layer 116*a* and the electrode layer 120*a*. The material of the dielectric layer 118*a* is, for example, a high dielectric constant material. In the case where the material of the dielectric layer 118*a* is a high dielectric constant material, the capacitance value of the capacitor 130 may be increased.

In some embodiments, the device layer 126 may further include a bonding layer 108*a* and a bonding layer 122*a*. The bonding layer 108*a* is disposed on the surface S4 of the semiconductor layer 106*a*. The bonding layer 108*a* in the device layer 126 closest to the substrate structure 100 (e.g., the device layer 126A) may be bonded to the bonding layer 104. The bonding layer 122*a* is disposed on the capacitor 130 and the semiconductor layer 106*a*. An end E2 of the bonding layer 108*a* may exceed an end E1 of the semiconductor layer 106*a*. The dielectric layer 118*a* may further be located between the electrode layer 120*a* and the bonding layer 108*a*. The bonding layer 108*a* of one of two adjacent device layers 126 may be bonded to the bonding layer 122*a* of the other one of two adjacent device layers 126. For example, the bonding layer 108*a* in the device layer 126E may be bonded to the bonding layer 122*a* in the device layer 126D.

The word line 134*a* is disposed on the sidewall of the channel layer 114. The word line 134*a* may be disposed across the plurality of device layers 126. The part of the word line 134*a* located on the sidewall of the channel layer 114 may serve as a gate G. In some embodiments, the memory structure 10 may further include a gate dielectric layer 132*a*. The gate dielectric layer 132*a* is located between the word line 134*a* and the channel region 114*a*. In some embodiments, a transistor T may include a doped region 110*a*, a doped region 112*a*, a channel region 114*a*, a gate G, and a gate dielectric layer 132*a*.

The contact 136 and the contact 138 are disposed in the plurality of device layers 126. The contact 136 is electrically connected to the plurality of doped regions 110*a*. The contact 138 is electrically connected to the plurality of electrode layers 120*a*.

As can be known based on the above embodiments, in the memory structure 10 and the manufacturing method thereof, the plurality of capacitors 130 in the plurality of device layers 126 are stacked on the substrate structure 100, the contact 136 is electrically connected to the plurality of doped regions 110*a*, and the contact 138 is electrically connected to the plurality of electrode layers 120*a*. As a result, the plurality of capacitors 130 stacked on the substrate structure 100 may be connected in parallel, increasing the capacitance value, helping reduce the area of the memory cell MC, and increasing the cell density.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory structure comprising:

a substrate structure; and a memory cell disposed on the substrate structure, and comprising:

a plurality of device layers stacked on the substrate structure, wherein the device layer comprises:

a semiconductor layer;

a first doped region, a second doped region, and a channel region disposed in the semiconductor layer, wherein the channel region is located between the first doped region and the second doped region, and the first doped region, the channel region, and the second doped region are arranged in a direction parallel to a top surface of the substrate structure; and a capacitor disposed on the semiconductor layer, and comprising a first electrode layer, a second electrode layer, and a dielectric layer, wherein the dielectric layer is located between the first electrode layer and the second electrode layer;

a word line disposed on a sidewall of the channel region;

a first contact disposed in the plurality of device layers, and electrically connected to the plurality of first doped regions; and a second contact disposed in the plurality of device layers, and electrically connected to the plurality of second electrode layers.

2. The memory structure according to claim 1, wherein the first electrode layer and the first doped region are located on different sides of the channel region, and the first electrode layer and the second doped region are located on the same side of the channel region.

3. The memory structure according to claim 1, wherein the first electrode layer is electrically connected to the second doped region.

4. The memory structure according to claim 1, wherein a width of the second electrode layer is greater than a width of the first electrode layer.

5. The memory structure according to claim 1, wherein the word line is disposed across the plurality of device layers.

6. The memory structure according to claim 1, wherein the semiconductor layer has a first surface and a second surface opposite to each other, the capacitor is disposed on the first surface of the semiconductor layer, and the device layer further comprises:

a first bonding layer disposed on the second surface of the semiconductor layer; and a second bonding layer disposed on the capacitor and the semiconductor layer.

7. The memory structure according to claim 6, wherein an end of the first bonding layer exceeds an end of the semiconductor layer, and the dielectric layer is further located between the second electrode layer and the first bonding layer.

8. The memory structure according to claim 6, wherein the first bonding layer of one of adjacent two of the device layers is bonded to the second bonding layer of the other one of the adjacent two of the device layers.

9. The memory structure according to claim 6, wherein the substrate structure comprises:

a substrate; and a third bonding layer disposed on the substrate, wherein the first bonding layer in the device layer closest to the substrate structure is bonded to the third bonding layer.

10. The memory structure according to claim 1, wherein a material of the dielectric layer comprises a high dielectric constant material.

11. The memory structure according to claim 1, further comprising:

a gate dielectric layer located between the word line and the channel region.

* * * * *